US011274976B2

(12) United States Patent
Badets et al.

(10) Patent No.: US 11,274,976 B2
(45) Date of Patent: Mar. 15, 2022

(54) TEMPERATURE SENSOR

(71) Applicant: Commissariat à l'Énergie Atomique et aux Énergies Alternatives, Paris (FR)

(72) Inventors: Franck Badets, Voiron (FR); Maxime Cozzi, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 70 days.

(21) Appl. No.: 16/709,969

(22) Filed: Dec. 11, 2019

(65) Prior Publication Data
US 2020/0182707 A1 Jun. 11, 2020

(30) Foreign Application Priority Data
Dec. 11, 2018 (FR) .................................... 1872708

(51) Int. Cl.
| *G01K 7/24* | (2006.01) |
|---|---|
| *H03B 5/00* | (2006.01) |
| *G01K 7/01* | (2006.01) |
| *H03B 5/04* | (2006.01) |
| *G01K 7/32* | (2006.01) |
| *H03K 3/03* | (2006.01) |

(52) U.S. Cl.
CPC .............. *G01K 7/245* (2013.01); *G01K 7/01* (2013.01); *G01K 7/32* (2013.01); *H03B 5/00* (2013.01); *H03B 5/04* (2013.01); *H03K 3/0315* (2013.01)

(58) Field of Classification Search
CPC ............ G01K 7/245; G01K 7/32; G01K 7/01; G01K 7/00; G01K 15/00; H03K 3/0315; H03B 5/00; H03B 5/04
USPC ...................... 331/176, 57; 374/185; 323/294
See application file for complete search history.

(56) References Cited

U.S. PATENT DOCUMENTS

| 4,549,818 A | * | 10/1985 | Nishikubo ............. G01K 7/245 |
|---|---|---|---|
| | | | 331/57 |
| 10,473,530 B2 | * | 11/2019 | Fan .......................... G01K 7/16 |
| 2009/0096495 A1 | | 4/2009 | Keigo |
| 2016/0241186 A1 | * | 8/2016 | Motz ........................ G01L 1/00 |
| 2016/0322976 A1 | * | 11/2016 | Chern .................. H03B 5/1209 |
| 2017/0038264 A1 | | 2/2017 | Odedara et al. |

FOREIGN PATENT DOCUMENTS

FR     1872708     10/2019

OTHER PUBLICATIONS

Preliminary Search Report for French Application 1872708, dated Oct. 25, 2019.

(Continued)

*Primary Examiner* — Arnold M Kinkead
(74) *Attorney, Agent, or Firm* — Wolf, Greenfield & Sacks, P.C.

(57) ABSTRACT

A temperature sensor supplying a measurement signal varying linearly to within 10% as a function of the temperature at least over a temperature range, including an oscillator supplied by a supply voltage and supplying a first oscillating signal, said oscillator including first MOS transistors, the voltage at each internal node of the oscillator having a dynamic range equal to the supply voltage, the measuring signal corresponding to the supply voltage.

16 Claims, 5 Drawing Sheets

(56) References Cited

OTHER PUBLICATIONS

Choi et al., A 110 nW resistive frequency locked on-chip oscillator with 34.3 ppm/° C. temperature stability for system-on-chip designs. IEEE Journal of Solid-State Circuits. Jul. 27, 2016;51(9):2106-18.
Hsiao et al., A 32.4 ppm/° C. 3.2-1.6 V self-chopped relaxation oscillator with adaptive supply generation. 2012 IEEE Symposium on VLSI Circuits (VLSIC). Jun. 13, 2012:14-5.
Paidimarri et al., A 120nW 18.5 kHz RC oscillator with comparator offset cancellation for±0.25% temperature stability. 2013 IEEE International Solid-State Circuits Conference Digest of Technical Papers. Feb. 17, 2013:184-5.
Ruffieux et al., Silicon Resonator Based 3.2 μW Real Time Clock With ± ppm Frequency Accuracy. IEEE Journal of Solid-State Circuits. Jan. 2010;45(1):224-34.
Sadeghi et al., A 0.007-mm$^2$ 108-ppm/° C. 1-MHz Relaxation Oscillator for High-Temperature Applications up to 180° C. in 0.13μm CMOS. IEEE Transactions on Circuits and Systems I: Regular Papers. 2013;60(7):1692-701.
Tokairin et al., A 280nW, 100kHz, 1-cycle start-up time, on-chip CMOS relaxation oscillator employing a feedforward period control scheme. 2012 IEEE Symposium on VLSI Circuits (VLSIC). Jun. 13, 2012:16-7.

\* cited by examiner

TEMPERATURE SENSOR

CROSS REFERENCE TO RELATED APPLICATIONS

Foreign priority benefits are claimed under 35 U.S.C. § 119(a)-(d) or 35 U.S.C. § 365(b) of French application number 1872708, filed Dec. 11, 2018. The contents of these applications are incorporated herein by reference in their entirety.

TECHNICAL FIELD

The present invention relates generally to temperature sensors.

BACKGROUND ART

For certain applications, there is a need for a temperature sensor supplying a substantially linear signal as a function of the temperature over an extended temperature range, for example from −40° C. to 250° C. There is a need for the temperature sensor to be compact and to have a low consumption. To that end, it would be desirable for the temperature sensor to be able to be made at least partially in common with another electronic circuit.

SUMMARY OF INVENTION

Thus, one aim of one embodiment is to address at least some of the drawbacks of the temperature sensors previously described.

One embodiment provides a temperature sensor supplying a measurement signal of the temperature, comprising a controllable current source, an oscillator and a circuit controlling the controllable current source configured to control the equivalent resistance of the oscillator to be equal to a reference resistance, the oscillator being supplied by the controllable current source at a first node having a supply voltage, the oscillator supplying a first oscillating signal having a dynamic range equal to the supply voltage, the measuring signal corresponding to the supply voltage.

According to one embodiment, the controllable current source comprises a first MOS transistor whose source is configured to be coupled to a source of a high reference potential, whose drain supplies the supply voltage to the first node, and whose gate is controlled by the control circuit.

According to one embodiment, the temperature sensor comprises an analog-digital converter receiving the supply voltage and supplying a converted digital signal to the control circuit, the control circuit being configured to select a resistance among several resistances from the converted digital signal, said resistances being substantially equal to the reference resistance in different temperature subranges of a temperature range.

According to one embodiment, the temperature sensor comprises a follower circuit receiving the supply voltage and outputting a copy of the supply voltage to the analog-digital converter coupled to the output of the follower circuit.

According to one embodiment, the control circuit comprises a current mirror comprising the second MOS transistor and a third MOS transistor, the control circuit further comprising an operational amplifier whose output is coupled to the gates of the second and third MOS transistors, wherein the first node is coupled to a first input of the operational amplifier and the control circuit comprises a circuit supplying a reference voltage to a second input of the operational amplifier, a current passing through the second MOS transistor, the supply circuit being configured to supply the reference voltage equal to the product of said current and the reference resistance.

According to one embodiment, the circuit supplying the reference voltage is configured to couple the second input to one of said resistances from a selection signal.

According to one embodiment, the control circuit comprises a digital circuit receiving the converted digital signal and determining the selection signal from the converted digital signal in order to select the resistance, among the resistances, substantially equal to the reference resistance.

According to one embodiment, the circuit supplying the reference voltage comprises first resistors, the first resistors having resistances substantially equal to the reference resistance in different temperature subranges of a temperature range, and a demultiplexer configured to couple one of the first resistors to the second input from the selection signal.

According to one embodiment, the circuit supplying the reference voltage comprises a second resistor having a resistance with a positive temperature coefficient coupled to a third resistor having a resistance with a negative temperature coefficient and a circuit configured to modify the ratio between the current circulating in the second resistor and the current circulating in the third resistor.

According to one embodiment, the oscillator comprises third MOS transistors.

According to one embodiment, the first oscillating signal oscillates at a first oscillation frequency, the temperature sensor comprising a frequency divider circuit receiving the first oscillating signal or a second signal oscillating at the first oscillation frequency and supplying a third signal oscillating at a second oscillation frequency that is a submultiple of the first oscillation frequency.

According to one embodiment, the analog-digital converter is paced by the third oscillating signal.

According to one embodiment, the oscillator is a ring oscillator.

According to one embodiment, the voltage at each internal node of the oscillator has a dynamic range equal to the supply voltage of the oscillator.

According to one embodiment, the third MOS transistors are configured to have a current passing through them varying linearly to within 10% as a function of the temperature over a temperature range, the sensor being configured to supply the measuring signal varying linearly to within 10% as a function of the temperature at least over the temperature range.

According to one embodiment, the temperature range varies from −40° C. to 250° C.

BRIEF DESCRIPTION OF DRAWINGS

The foregoing features and advantages, as well as others, will be described in detail in the following description of specific embodiments given by way of illustration and not limitation with reference to the accompanying drawings, in which.

DESCRIPTION OF EMBODIMENTS

Like features have been designated by like references in the various figures. In particular, the structural and/or functional features that are common among the various embodiments may have the same references and may dispose identical structural, dimensional and material properties. For the sake of clarity, only the elements that are useful for an understanding of the embodiments described herein have been illustrated and described in detail. Unless specified otherwise, the expressions "around", "approximately", "substantially" and "in the order of" signify within 10%, and preferably within 5%. Unless indicated otherwise, when reference is made to two elements connected together, this signifies a direct connection without any intermediate elements other than conductors, and when reference is made to two elements coupled together, this signifies that these two elements can be connected or they can be coupled via one or more other elements. Additionally, in the remainder of the description, the voltages are referenced with respect to a low reference potential, for example the ground potential, taken as being equal to 0 V. Furthermore, in the remainder of the description, the same reference is used to designate a resistor and the resistance of said resistor. Additionally, a "binary signal" refers to a signal that alternates between a first constant state, for example a low state, denoted "0", and a second constant state level, for example a high state, denoted "1". The high and low states of different binary signals of a same electronic circuit can be different. In practice, the binary signals can correspond to voltages or currents that may not be perfectly constant in the high or low state.

Figure 1:
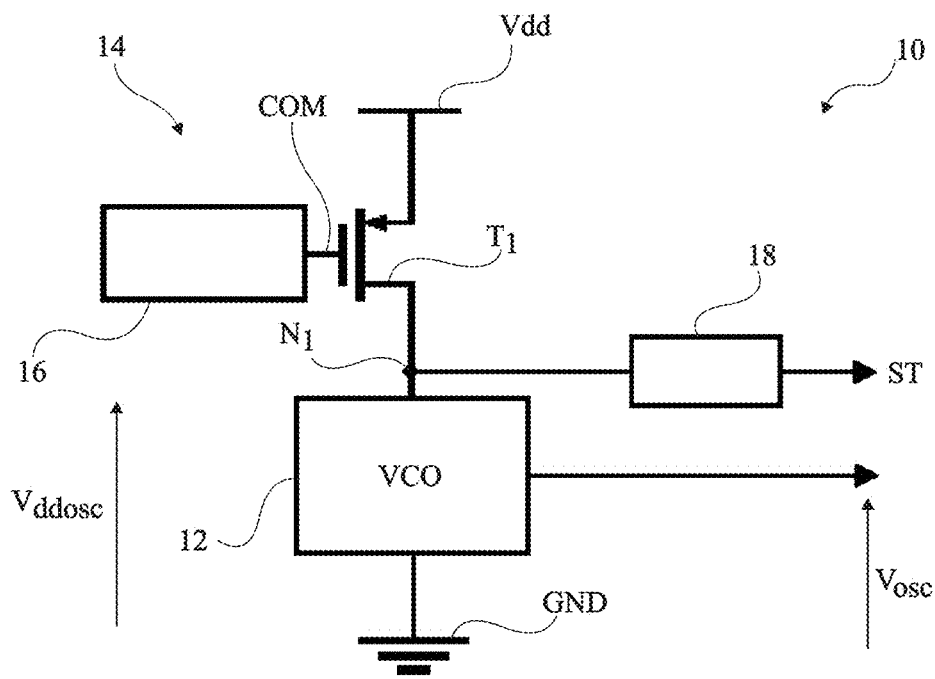
FIG. 1 partially and schematically shows one embodiment of a temperature sensor.

FIG. 1 shows an embodiment of a temperature sensor 10. The temperature sensor 10 comprises a voltage-controlled oscillator 12 (VCO). The oscillator 12 is coupled, preferably connected, to a source GND of a low reference potential, for example the ground. The oscillator 12 is further coupled, preferably connected, to a node $N_1$ receiving a supply voltage $V_{ddosc}$ of the oscillator 12. The oscillator 12 supplies an oscillating signal $V_{osc}$ at an oscillation frequency f, for example a binary voltage alternating between two levels at the frequency f. The sensor 10 further comprises a circuit 14 supplying the supply voltage $V_{ddosc}$ comprising a controllable current source supplying the oscillator. The controllable current source for example comprises an insulated-gate field-effect transistor $T_1$, also called MOS transistor, for example P-channel, the drain of which is coupled to the node $N_1$ and the source of which is coupled to a source $V_{dd}$ of a high reference potential. The circuit 14 further comprises a circuit 16 controlling the controllable current source, for example supplying a control signal COM to the gate of the transistor $T_1$. The temperature sensor 10 further comprises an adaptation circuit 18 receiving the supply voltage $V_{ddosc}$ at the node $N_1$ and supplying a signal ST.

The oscillator 12 is configured to supply the oscillating signal $V_{osc}$ with a dynamic range equal to the supply voltage $V_{ddosc}$. In an embodiment, the circuit 16 controlling the controllable current source is configured to control the equivalent resistance of the oscillator 12 to be equal to a reference resistance. The oscillator 12 is therefore controlled so that the oscillation frequency f remains substantially constant. With such an architecture, the inventors have shown that the variations of the supply voltage $V_{ddosc}$ are representative of the variations of the temperature.

The oscillator 12 is an oscillator comprising MOS transistors, in particular P-channel MOS transistors and/or N-channel MOS transistors. The oscillator 12 is for example a ring oscillator. The oscillator 12 can further comprise other electronic components, for example capacitors. The electronic components of the oscillator 12 are connected to one another such that, for each internal node of the oscillator 12, that is to say, each node between two electronic components of the oscillator 12, the voltage at the node varies during operation over a voltage range substantially equal to the supply voltage $V_{ddosc}$. For such an oscillator 12, the inventors have shown that the supply voltage $V_{ddosc}$ varies substantially linearly with the temperature over a wide temperature range, in particular at least over the range varying from −40° C. to 250° C.

The signal ST, supplied by the adaptation circuit 18 and obtained from the supply voltage $V_{ddosc}$, is an analog or digital signal that varies substantially linearly as a function of the temperature. According to one embodiment, the adaptation circuit 18 comprises an analog-digital converter. According to one embodiment, the adaptation circuit 18 comprises a follower circuit. The adaptation circuit 18 may not be present, the signal ST then being equal to the supply voltage $V_{ddosc}$. The signal ST can be used by another electronic circuit and/or can be used by the temperature sensor 10 itself. The temperature sensor 10 therefore supplies both the signal ST, which varies substantially linearly with the temperature, and the signal $V_{osc}$, which oscillates at the oscillation frequency f.

Figure 2:
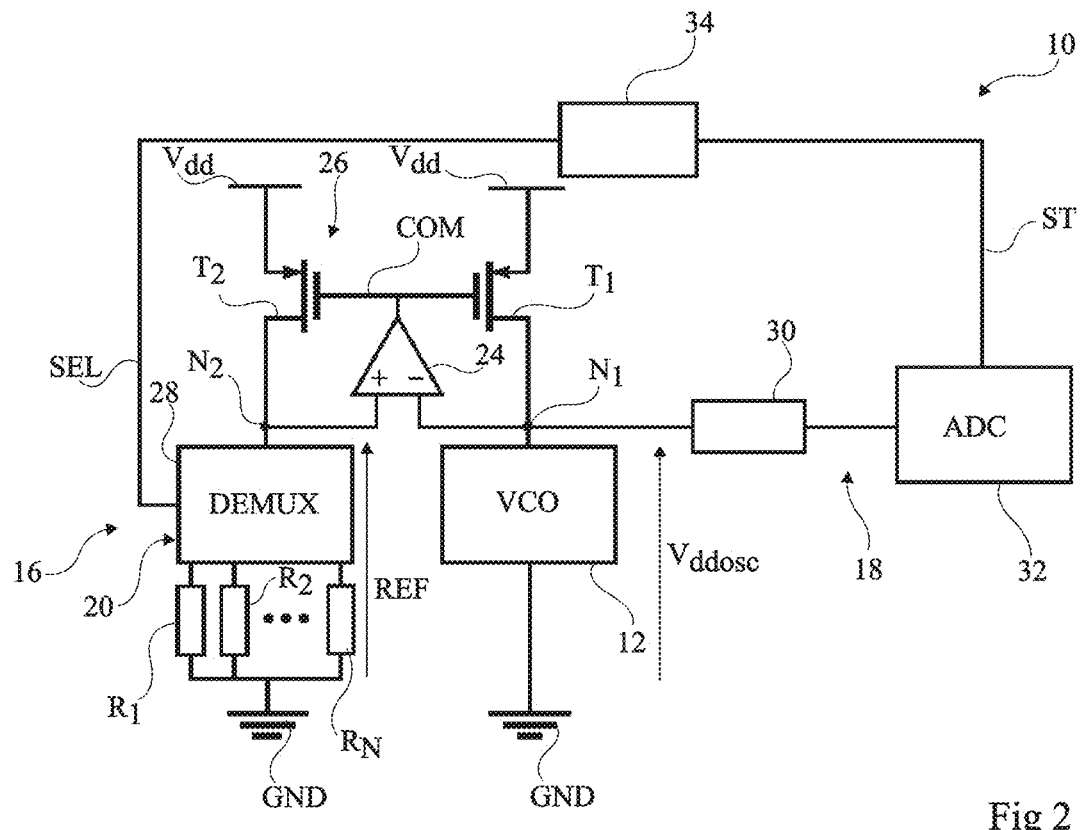
FIG. 2 shows a more detailed embodiment of the temperature sensor of FIG. 1.

FIG. 2 shows a more detailed embodiment of the device 10 shown in FIG. 1, in which the control circuit 16 comprises a circuit 20 for supplying a reference signal REF to a node $N_2$. The circuit 20 further comprises an operational amplifier 24 receiving the signal $V_{ddosc}$ at the non-inverting input (+), and the signal REF at the inverting input (−), and supplying the control signal COM to the gate of the transistor $T_1$ so that the signals $V_{ddosc}$ and REF become the same. The device 10 further comprises an active input current mirror 26 comprising the operational amplifier 24, the transistor $T_1$ and a MOS transistor $T_2$, in particular P-channel, the source of which is coupled to the source Vdd of the high reference potential, the drain of which is coupled to the node $N_2$ and the gate of which is coupled to the gate of the transistor T1.

The circuit 20 supplying the reference signal REF comprises temperature-compensated resistors $R_1$ to $R_N$, where N is an integer, for example between 1 and 6. The circuit 20 further comprises a demultiplexer 28 (DEMUX), each resistor $R_1$ to $R_N$ comprising a first terminal coupled, preferably connected, to the source GND of the low reference potential and a second terminal coupled, preferably connected, to an input of the demultiplexer 28. The demultiplexer 28 is configured to connect one of the resistors $R_1$ to $R_N$ to the node $N_2$ as a function of a selection signal SEL.

The adaptation circuit 18 comprises, in the present embodiment, a follower circuit 30 coupled to an analog-digital converter 32 (ADC), the input of the follower circuit 30 being coupled, preferably connected, to the node N1, the output of the follower circuit 30 being coupled, preferably connected, to the input of the analog-digital converter 32, and the analog-digital converter 32 supplying the signal ST.

The control circuit 16 further comprises a digital selection circuit 34 for one of the resistances $R_1$ to $R_N$, receiving the signal ST and supplying a control signal SEL to the demultiplexer 28. The digital selection circuit 34 can be supplied by a source for supplying a high reference potential, not shown, different from the source $V_{dd}$.

Each resistor $R_1$ to $R_N$ is a resistor whose resistance varies as a function of the temperature, for example successively having a growth phase as a function of the temperature, passing through a maximum and a decrease phase as a function of the temperature. According to one embodiment, the maximum resistances of the resistors $R_1$ to $R_N$ are obtained for increasing temperatures, that is to say, for any pair i and j varying from 1 to N with i strictly less than j, the temperature at which the maximum resistance of the resistor $R_i$ is obtained is strictly less than the temperature at which the maximum resistance of the resistor $R_j$ is obtained. According to one embodiment, each resistor $R_1$ to $R_N$ comprises a resistor with a negative temperature coefficient in series with a resistor with a positive temperature coefficient.

Figure 3:
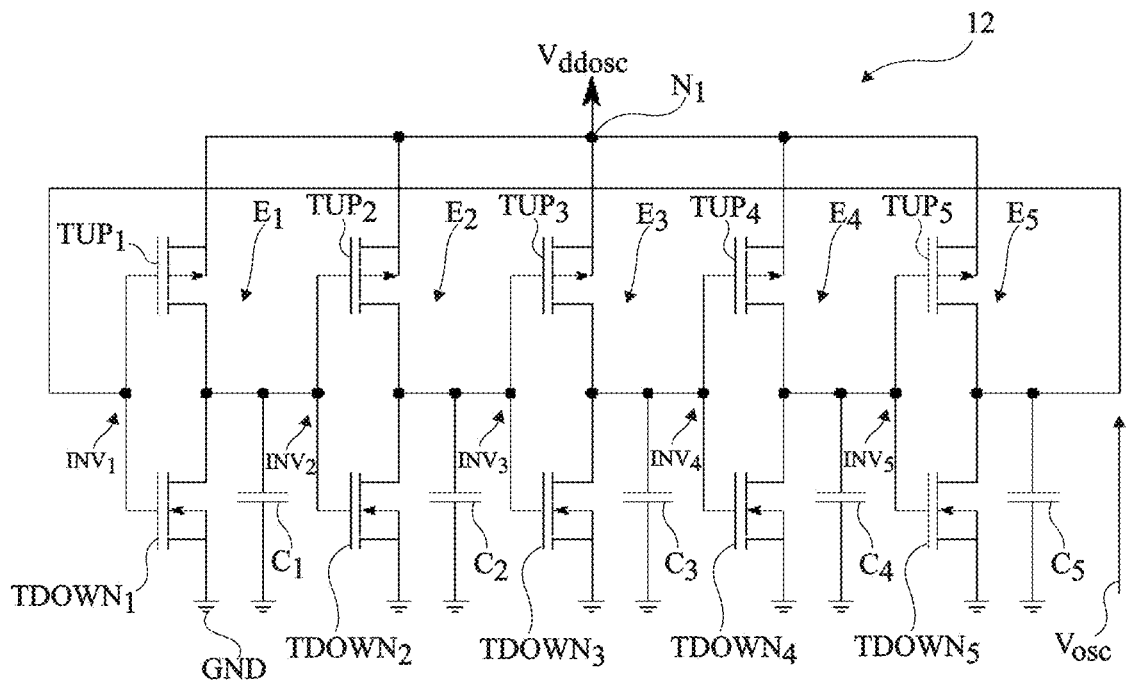
FIG. 3 shows an embodiment of an oscillator.

FIG. 3 shows an embodiment of the oscillator 12 in which the oscillator 12 corresponds to a ring oscillator comprising a succession of stages $E_1$ to $E_M$, where M is an odd integer at least equal to 3, M being equal to 5 in the embodiment shown in FIG. 3. Each stage $E_j$, j varying from 1 to M, comprises an inverter $INV_j$ and a capacitor $C_j$. The input of the inverter $INV_j$ of the stage $E_j$ is coupled, preferably connected, to the output of the inverter $INV_k$ of the stage. $E_k$, where k is greater than or equal to 1 and strictly less than j and j is less than or equal to N. The input of the inverter $INV_1$ of the stage $E_1$ is coupled, preferably connected, to the output of the inverter $INV_M$ of the stage $E_M$. The capacitor $C_j$ of the stage $E_j$ comprises a first electrode coupled, preferably connected, to the output of the inverter $INV_j$ and a second electrode coupled, preferably connected, to the source BND of the low reference potential. According to one embodiment, the inverter $INV_j$ comprises a MOS transistor $TUP_j$, for example P-channel, whose source is coupled, preferably connected, to the node $N_1$, whose drain is coupled, preferably connected, to the output of the inverter $INV_j$ and whose gate is coupled, preferably connected, to the input of the inverter $INV_j$. According to one embodiment, the inverter $INV_j$ comprises a MOS transistor $TDOWN_j$, for example N-channel, whose source is coupled, preferably connected, to the source GND of the low reference potential, whose drain is coupled, preferably connected, to the output of the inverter $INV_j$ and whose gate is coupled, preferably connected, to the input of the inverter $INV_j$. The capacitors $C_j$ can correspond to internal capacitances of the MOS transistors or to separate electronic components. The capacitances of the capacitors $C_j$ can be identical.

Figure 4:
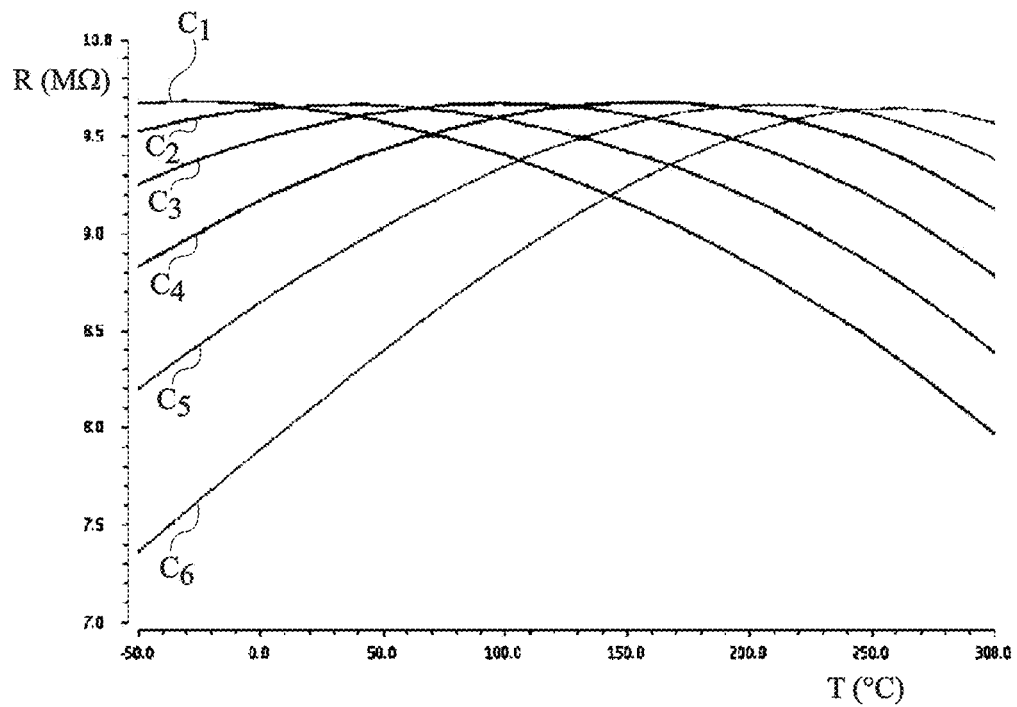
FIG. 4 shows variation curves of resistances as a function of the temperature.

FIG. 4 shows evolution curves $C_1$ to $C_6$ of the resistance R of resistors $R_1$ to $R_6$ of the circuit 20 as a function of the temperature T. Each curve $C_1$ to $C_6$ is bell-shaped, the maxima of the resistances $R_1$ to $R_6$ being substantially equal. The curves are offset in temperature relative to one another such that the maximums of the curves $C_1$ to $C_6$ are substantially evenly distributed over the temperature range from −50° C. to 250° C.

The operation of the device 10 shown in FIG. 3 is as follows. The signal ST, supplied by the converter 32, corresponds to the analog/digital conversion of the voltage $V_{ddosc}$. The voltage $V_{ddosc}$ varies substantially linearly with the temperature; the digital signal ST also varies substantially linearly with the temperature. The selection circuit 34 supplies the signal SEL for the selection of one of the resistances $R_1$ to $R_N$ as a function of the temperature indicated by the signal ST. According to one embodiment, the selection circuit 34 comprises a memory in which thresholds are stored delimiting N temperature ranges $RT_1$ to $RT_N$, successive and adjacent, each temperature range $RT_i$, for i varying from 1 to N, being the range in which the resistance $R_i$ passes through its maximum. Preferably, each temperature range $RT_i$ is substantially centered on the temperature corresponding to the maximum of the associated resistance $R_i$. The selection circuit 34 is then configured to compare the signal ST to the thresholds and to supply a selection signal SEL of the resistance $R_i$ associated with the temperature range $RT_i$ to which the signal SEL belongs. The demultiplexer 28 then couples the selected resistance $R_i$ to the node $N_2$. According to one embodiment, the number N of resistors $R_i$ and the expanse of each temperature range $RT_i$ are chosen such that the resistance $R_i$ associated with the temperature range $RT_i$ varies relative to the maximum resistance by less than 2%, preferably less than 0.5%, over the temperature range $RT_i$. As a result, the resistance coupled to the node $N_2$ is substantially constant to within 2%, preferably to within 0.5%, over a wide temperature range, in particular from −40° C. to 250° C.

The equivalent resistance $R_{dcosc}$ of the oscillator 12 is given by the following relationship 1):

$$R_{dcosc} = V_{ddosc}/I_{ddosc} \qquad \text{[Math 1]}$$

The voltage at each internal node of the oscillator 12 varying during operation over a voltage range substantially equal to the supply voltage $V_{ddosc}$, the power consumed by the oscillator 12 follows the following relationship 2), calling $C_{osc}$ the equivalent capacity of the oscillator 12:

$$P = C_{osc} f V_{ddosc}^2 \qquad \text{[Math 2]}$$

As an example, for the oscillator 12 shown in FIG. 3, the equivalent capacity $C_{osc}$ of the oscillator 12 is equal to $M*C_1$. The frequency f of the oscillating signal supplied by the oscillator 12 can then be expressed as a function of the DC resistance $R_{dcosc}$ of the oscillator 12 according to the following relationship 3):

$$f = \frac{1}{R_{dcosc} C_{osc}} \qquad \text{[Math 3]}$$

The operational amplifier 24 tends to keep the voltage REF at the node $N_2$ and the voltage $V_{ddosc}$ at the node $N_1$ equal, and therefore to keep the current $I_{ddosc}$ and the current at the node $N_2$ equal. Everything happens as if the current mirror at the active input 26 forces the resistance $R_{dcosc}$ to be equal to the resistance $R_i$ coupled to the node $N_2$, selected among the resistances $R_1$ to $R_N$. As a result, since the resistance coupled to the node $N_2$ is substantially constant irrespective of the temperature over an extended temperature range, in particular from −40° C. to 250° C., the resistance $R_{ddosc}$ and therefore the frequency f of the oscillator 12 remains substantially constant irrespective of the temperature over the extended temperature range, in particular from −40° C. to 250° C. This allows the use of the signal $V_{osc}$ at a stable frequency in applications in which the temperature can vary significantly, in particular in the fields of drilling, monitoring industrial processes or monitoring operating parameters of engines in aeronautic or automotive applications.

Another advantage is that the number of calibration points necessary to calibrate the oscillator 12 is reduced. Indeed, a calibration with two points is sufficient to calibrate the oscillator 12. The duration of the tests of the oscillator 12 is therefore reduced. The production cost of the oscillator 12 is therefore reduced.

Figure 5:
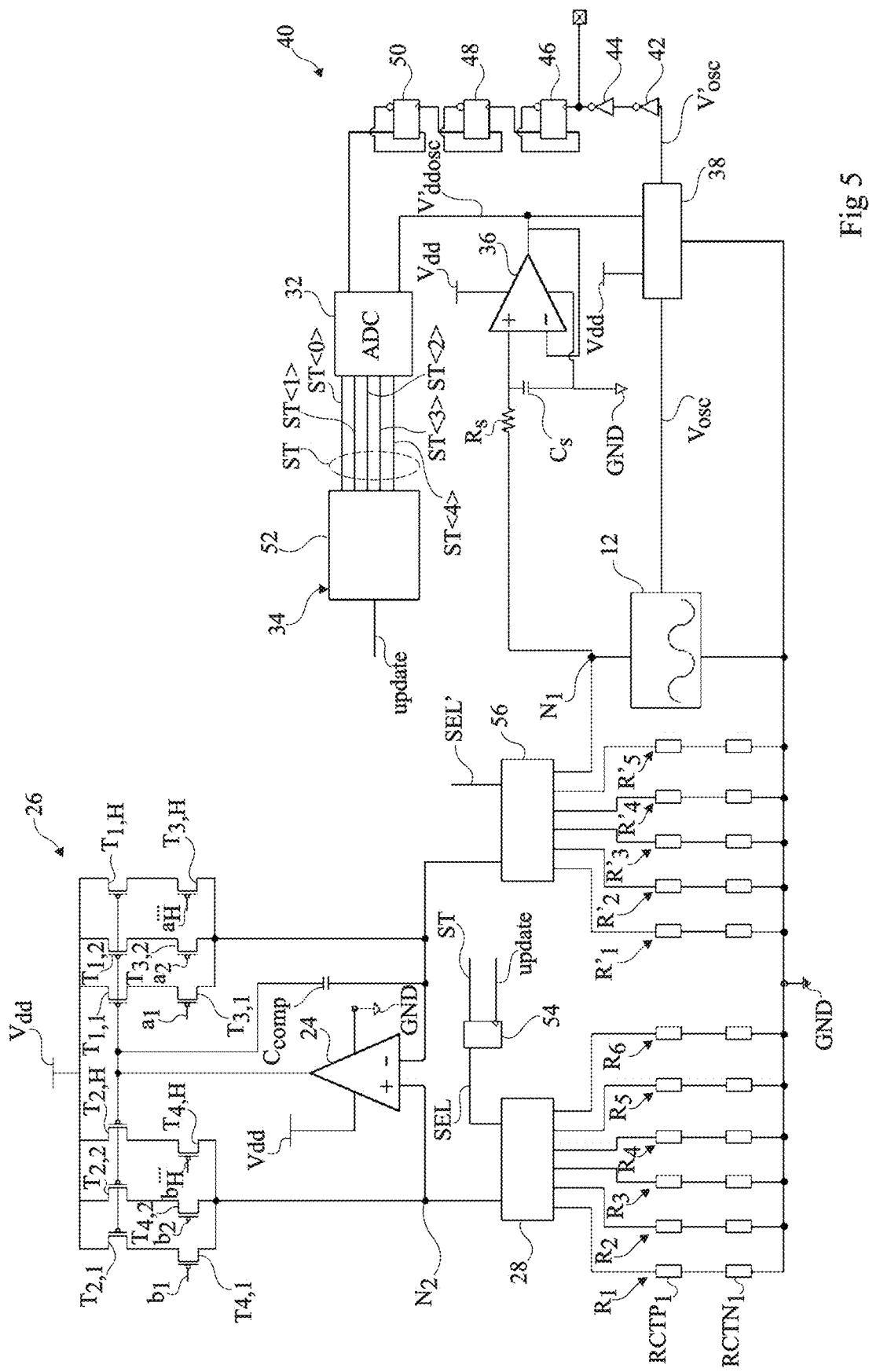
FIG. 5 shows a more detailed embodiment of the device shown in FIG. 3.

FIG. 5 shows a more detailed embodiment of the device 10 of FIG. 3. In FIG. 5, each resistor $R_i$, i varying from 1 to N, comprises a resistor $RCTP_i$ with a positive temperature coefficient in series with a resistor $RCTN_i$ with a negative temperature coefficient.

In the present embodiment, the mirror current circuit 26 further makes it possible to calibrate the oscillation frequency of the oscillator 12. The mirror current circuit 26 comprises a number H of branches A, i varying form 1 to H, mounted in parallel between the inverter input (−) of the operational amplifier 24 and the source $V_{dd}$ of the high reference potential and H branches $A'_i$, i varying from 1 to H, mounted in parallel between the node $N_2$ and the source $V_{dd}$ of the high reference potential. The number H can vary from 1 to $2^N$ with N being able to vary from 1 to 10, for example. Each branch $A_i$ can comprise a current source made for example by a MOS transistor $T_{1,i}$, for example P-channel, still on, whose voltage value on the gate sets the value of the current passing through it in series with a MOS transistor $T_{3,i}$, for example P-channel. Each branch $A'_i$ can comprise a current source for example made by a MOS transistor $T_{2,i}$, for example P-channel, still on, whose voltage value on the gate sets the value of the current passing through it in series with a MOS transistor $T_{4,i}$, for example P-channel. The output of the operational amplifier 24 is coupled, preferably connected, to the gates of the transistors $T_{1,1}$ to $T_{1,H}$ and $T_{2,1}$ to $T_{2,H}$. The gates of the transistors $T_{3,1}$ to $T_{3,H}$ are respectively controlled by binary controls a1 to $a_O$ and the gates of the transistors $T_{4,1}$ to $T_{4,H}$ are respectively controlled by binary controls $b_1$ to $b_O$. The binary commands $a_1$ to $a_O$ and $b_1$ to $b_O$ make it possible to select some of the current sources among the transistors $T_{1,1}$ to $T_{1,H}$ and some of the current sources among the transistors $T_{2,1}$ to $T_{2,H}$, which makes it possible to adjust the current ratio passing through the selected resistor $R_i$ and the oscillator 12. This makes it possible to calibrate the frequency of the oscillator. The control circuit 16 further comprises a capacitor $C_{comp}$, one electrode of which is coupled, preferably connected, to the gates of the transistors $T_{1,i}$ and $T_{2,i}$ and the other electrode of which is coupled, preferably connected, to the inverting input (−) of the operational amplifier 24.

Furthermore, FIG. 5 shows an embodiment of the follower circuit 30 in which the follower circuit 30 comprises an operational amplifier 36 coupled, for its power source, to the source $V_{dd}$ of the high reference potential, or to another source of a high reference potential, and to the source GND of the low reference potential, receiving the voltage $V_{ddosc}$ and supplying the voltage $V'_{ddosc}$, which is a copy of the voltage $V_{ddosc}$. The output of the operational amplifier 36 is coupled, preferably connected, to the inverting input (V−) of the operational amplifier 36. The follower circuit 30 further comprises a resistor $R_S$, one terminal of which is coupled, preferably connected, to the node $N_1$ and the other terminal of which is coupled, preferably connected, to the noninverting input (+) of the operational amplifier 36 and a capacitor $C_S$ whereof one electrode is coupled, preferably connected, to the source GND of the low reference potential and the other electrode of which is coupled, preferably connected, to the noninverting input (+) of the operational amplifier 36.

According to one embodiment, the supply circuit 18 further comprises a level conversion circuit 38 coupled, for its power source, to the source $V_{dd}$ of the high reference potential, or to another source of a high reference potential, and to the source GND of the low reference potential, comprising an input receiving the oscillating signal $V_{osc}$ supplied by the oscillator 12 and an output supplying an oscillating signal $V'_{osc}$. The level conversion circuit 38 further comprises an input coupled, preferably connected, to the output of the follower circuit 30 and receiving the signal $V'_{ddosc}$. The level conversion circuit 38 supplies the signal $V'_{osc}$ at the same frequency f as the oscillating signal $V_{osc}$ but with a different dynamic range, which in particular depends on the signal $V'_{ddosc}$. In particular, when the signal $V_{osc}$ is a binary signal, the signal $V'_{osc}$ is a binary signal follows [sic] the signal $V_{osc}$ with different levels "0" and "1".

The adaptation circuit 18 further comprises a frequency divider circuit 40 adapted to the case where the signal $V'_{osc}$ is binary. The circuit 18 comprises two inverters 42, 44 and three D flip-flops 46, 48, 50. The input of the first inverter 42 receives the signal $V'_{osc}$. The output of the first inverter 42 is coupled, preferably connected, to the input of the second inverter 44. The output of the second inverter 44 is coupled, preferably connected, to the clock input of the first D flip-flop 46. The noninverted output of the first D flip-flop 46 is coupled, preferably connected, to the clock input of the second D flip-flop 48. The inverted output of the first D flip-flop 46 is coupled, preferably connected, to the data input of the first D flip-flop 46. The noninverted output of the second D flip-flop 48 is coupled, preferably connected, to the clock input of the third D flip-flop 50. The inverted output of the second D flip-flop 48 is coupled, preferably connected, to the data input of the second D flip-flop 48. The inverted output of the third D flip-flop 50 is coupled, preferably connected, to the data input of the third D flip-flop 50. The noninverted output of the third D flip-flop 50 supplies a signal Clk. The signal Clk is a binary signal that oscillates at a frequency equal to f divided by $2^Q$, where Q is the number of D flip-flops (Q being equal to three in FIG. 3).

The analog-digital converter 32 receives the voltage $V'_{ddosc}$ on an input and is paced by the signal Clk. In the present embodiment, the analog-digital converter 32 supplies the digital signal ST, corresponding to the analog/digital conversion of the voltage $V'_{ddosc}$, encoded for example on 5 bits ST<0>, ST<1>, ST<2>, ST<3> and ST<4>.

According to one embodiment, the selection circuit 34 comprises a circuit 52 receiving the digital signal ST and supplying an update signal encoded on one bit. The circuit 52 is configured to supply a pulse of the update signal when the range of temperatures designated by the digital signal ST changes and optionally when one or several additional conditions is(are) met. To that end, the circuit 52 can compare the digital signal ST to thresholds. According to one embodiment, for each bound of a range of temperatures, two comparison thresholds can be used, a first comparison threshold when the digital signal ST is increasing and a second comparison threshold when the digital signal ST is decreasing. This makes it possible to obtain a hysteresis effect in order to avoid the unwanted emission of successive pulses of the update signal for small oscillations of the signal ST around a threshold. As a variant, the circuit 52 only supplies a pulse of the update signal when the digital signal continuously designates a new temperature range during a given duration.

The selection circuit 34 further comprises a control circuit 54 receiving the digital signal ST and the update signal and supplying the selection signal SEL. According to one embodiment, the control circuit 52 is configured to determine a new value of the selection signal SEL from the last value of the signal ST received upon receiving a pulse from the update signal.

According to the embodiment shown in FIG. 5, the device 10 further comprises resistors $R'_1$ to $R'_{N-1}$ and a demultiplexer 56. The N−1 resistors $R'_1$ to $R'_{N-1}$ are equal to N−1 of the N resistors $R_1$ to $R_N$. The resistors $R'_1$ to $R'_{N-1}$ and the oscillator 12 are coupled, preferably connected, to the demultiplexer 56. The demultiplexer 56 is controlled by a constant signal SEL' so as to continuously couple the node $N_1$ to the inverter input (−) of the operational amplifier 24, such that the resistors $R'_1$ to $R'_N$ are never connected to the inverter input of the amplifier 24. The presence of the demultiplexer 56 makes it possible to ensure that the leak currents connected to the demultiplexers 28, 56 at the inverter and non-inverter inputs of the operational amplifier 24 are as close as possible.

Figure 6:
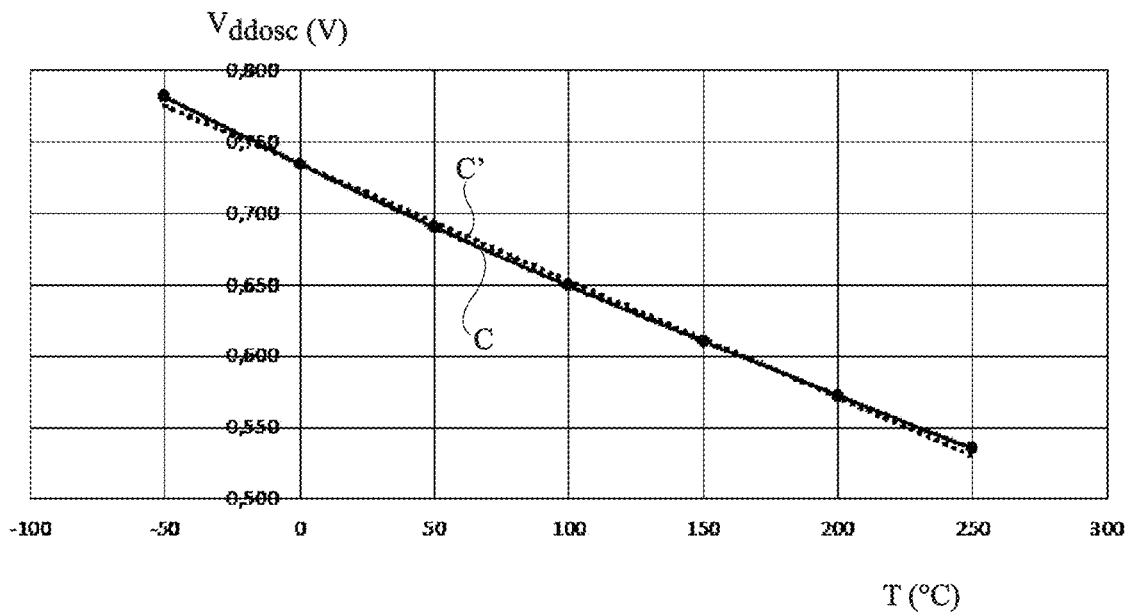
FIG. 6 shows an evolution curve of the supply voltage of the oscillator of the device shown in FIG. 5 as a function of the temperature.

FIG. 6 shows a curve C, obtained by simulation, of the evolution of the voltage $V_{ddosc}$ of the temperature sensor 10 shown in FIG. 5 as a function of the temperature T. Curve C' in dotted lines shows the curve that would be obtained if the voltage $V_{ddosc}$ were to vary perfectly linearly as a function of the temperature T. As shown in FIG. 6, curves C and C' are practically combined from −50° C. to 250° C. such that the use of the voltage $V_{ddosc}$ as signal representative of the temperature over a wide range of temperatures is relevant.

Figure 7:
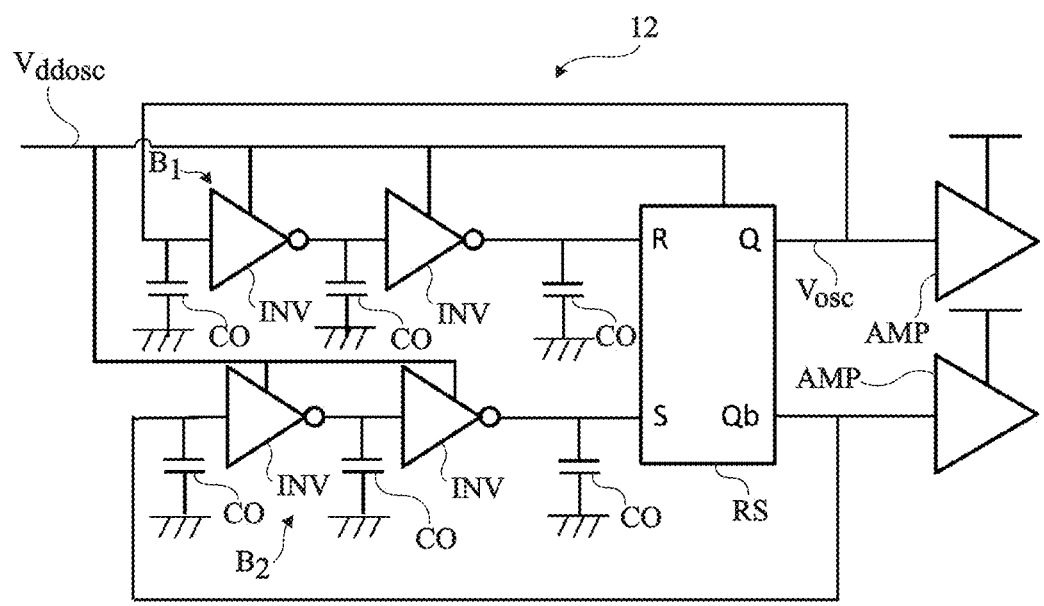
FIG. 7 shows a variant of the oscillator of the device shown in FIG. 3.

FIG. 7 shows another embodiment of the oscillator 12 in which the oscillator 12 comprises two branches $B_1$ and $B_2$, each branch $B_1$, $B_2$ comprising two inverters INV in series powered by the voltage $V_{ddosc}$. The oscillator 12 further comprises a latch RS whose input R is coupled, preferably connected, to the output of the first branch $B_1$, whose input S is coupled, preferably connected, to the output of the second inverter INV of the second branch $B_2$, whose output Q is coupled, preferably connected, to the input of the first inverter INV of the branch $B_1$ and whose output Qb is coupled, preferably connected, to the input of the first inverter INV of the branch $B_2$. The signal $V_{osc}$ supplied to the outputs Q and the complementary signal supplied to the output Qb can be transmitted to amplifiers AMP. The oscillator 12 can comprise capacitors CO at the input and/or output of the inverters INV.

Figure 8:
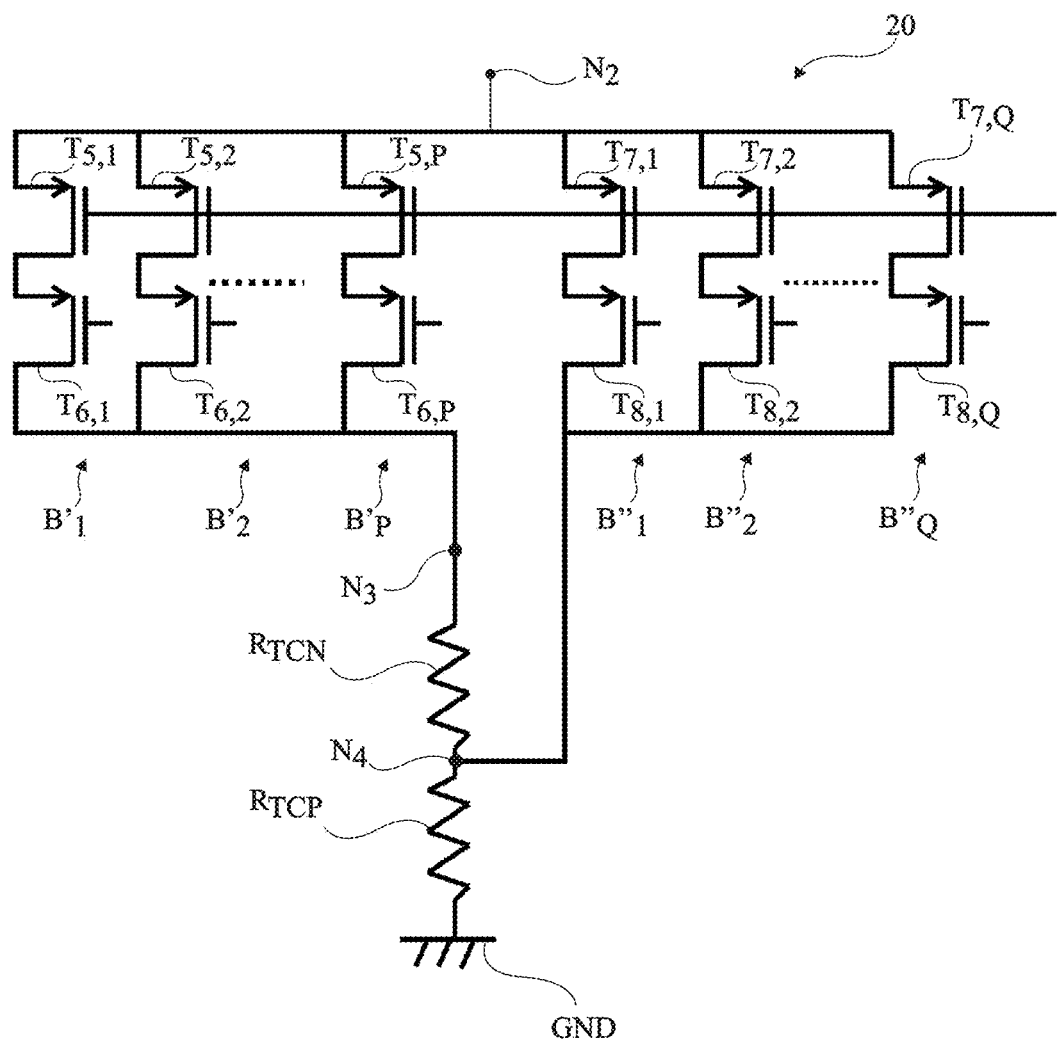
FIG. 8 shows a variant of another part of the device shown in FIG. 3.

FIG. 8 shows another embodiment of the circuit 20 for supplying the reference signal REF to the node $N_2$ in which the circuit 20 comprises a resistor $R_{TCN}$ having a resistance with a negative temperature coefficient mounted between a node $N_3$ and a node $N_4$ and a resistor $R_{TCP}$ having a resistant with a positive temperature coefficient mounted between the node $N_4$ and the source GND of the low reference potential. The circuit 20 further comprises P branches $B'_i$, i varying from 1 to P, mounted in parallel between the node $N_2$ and the node $N_4$ and Q branches $B''_k$, k varying from 1 to Q, mounted in parallel between the node $N_2$ and the node $N_4$. The branches $B'_1$ to $B'_P$ and $B''_1$ to $B''_Q$ make it possible to control the ratio between the current circulating in the resistor $R_{TCN}$ and the current circulating in the resistor $R_{TCP}$. Each branch $B'_i$ can comprise a current source made for example by a MOS transistor $T_{5,i}$, for example P-channel, still on, whose voltage value on the gate sets the value of the current passing through it in series with a MOS transistor $T_{6,i}$, for example P-channel. Each branch $B'_i$ can comprise a MOS transistor $T_{7,i}$, for example P-channel, still on, whose voltage value on the gate sets the value of the current passing through it in series with a MOS transistor $T_{8,i}$, for example P-channel. The gates of the transistors $T_{6,1}$ to $T_{6,P}$ and $T_{8,1}$ to $T_{8,Q}$ are controlled from the signal SEL. When the transistor $T_{6,i}$ is placed in the on state, it is configured to allow a current to pass equal to $a_iI$. When the transistor $T_{8,k}$ is placed in the on state, it is configured to allow a current to pass equal to $b_kI$. As a result, the equivalent resistance $R_{EQ}$ of the circuit 20 is given by the following relationship 4):

$$R_{EQ}=R_{TCN}\Sigma a_i+R_{TCP}(\Sigma a_i+\Sigma b_k) \qquad [\text{Math 4}]$$

The value of the resistance $R_{EQ}$ coupled to the node $N_2$ can therefore be controlled by modifying the number of transistors $T_{6,i}$ that are in the on state among the P transistors $T_{6,1}$ to $T_{6,P}$ and/or the number of transistors $T_{8,k}$ that are in the on state among the Q transistors $T_{8,1}$ to $T_{8,Q}$. The circuit 20 of FIG. 8 advantageously has reduced leak currents.

Various embodiments and variants have been described. Those skilled in the art will understand that certain features of these embodiments can be combined and other variants will readily occur to those skilled in the art. In particular, architectures of the circuit 16 controlling the controllable current source, controlling the equivalent resistance of the oscillator 12 to be equal to a reference resistance, other than the one shown in FIG. 2 can be implemented. Moreover, in the previously disclosed embodiments, the circuit 20 supplying the reference signal REF comprises several resistors. According to another embodiment, the circuit 20 supplying the reference signal REF comprises a signal resistor having a substantially constant resistance over the temperature range and the demultiplexer 28 and the selection circuit 34 may not be present. Finally, the practical implementation of the embodiments and variants described herein is within the capabilities of those skilled in the art based on the functional description provided hereinabove.

The invention claimed is:

1. A temperature sensor supplying a measurement signal of the temperature, comprising a controllable current source, an oscillator and a circuit controlling the controllable current source configured to control the equivalent resistance of the oscillator to be equal to a reference resistance, the oscillator being supplied by the controllable current source at a first node having a supply voltage, the oscillator supplying a first oscillating voltage having a dynamic range equal to the supply voltage, the measuring signal corresponding to the supply voltage.

2. The temperature sensor according to claim 1, wherein the controllable current source comprises a first MOS transistor whose source is configured to be coupled to a source of a high reference potential, whose drain supplies the supply voltage to the first node, and whose gate is controlled by the control circuit.

3. The temperature sensor according to claim 1, comprising an analog-digital converter receiving the supply voltage and supplying a converted digital signal to the control circuit, the control circuit being configured to select a resistance among several resistances from the converted digital signal, said resistances being substantially equal to the reference resistance in different temperature subranges of a temperature range.

4. The temperature sensor according to claim 3, comprising a follower circuit receiving the supply voltage and outputting a copy of the supply voltage and wherein the analog-digital converter is coupled to the output of the follower circuit.

5. The temperature sensor according to claim 2, wherein the control circuit and the controllable current source comprise a current mirror comprising the first MOS transistor and a second MOS transistor, the control circuit further comprising an operational amplifier whose output is coupled to the gates of the first and second MOS transistors, and wherein the first node is coupled to a first input of the operational amplifier and wherein the control circuit comprises a circuit supplying a reference voltage to a second input of the operational amplifier, a current passing through the second MOS transistor, the supply circuit being configured to supply the reference voltage equal to the product of said current and the reference resistance.

6. The temperature sensor according to claim 5, wherein the circuit supplying the reference voltage is configured to couple the second input to one of said resistances from a selection signal.

7. The temperature sensor according to claim 6, wherein the control circuit comprises a digital circuit receiving the converted digital signal and determining the selection signal from the converted digital signal in order to select the resistance, among the resistances, substantially equal to the reference resistance.

8. The temperature sensor according to claim 6, wherein the circuit supplying the reference voltage comprises first resistors, the first resistors having resistances substantially equal to the reference resistance in different temperature subranges of a temperature range, and a demultiplexer configured to couple one of the first resistors to the second input from the selection signal.

9. The temperature sensor according to claim 6, wherein the circuit supplying the reference voltage comprises a second resistor having a resistance with a positive temperature coefficient coupled to a third resistor having a resistance with a negative temperature coefficient and a circuit configured to modify the ratio between the current circulating in the second resistor and the current circulating in the third resistor.

10. The temperature sensor according to claim 2, wherein the oscillator comprises third MOS transistors.

11. The temperature sensor according to claim 1, wherein the first oscillating signal oscillates at a first oscillation frequency, the temperature sensor comprising a frequency divider circuit receiving the first oscillating signal or a second signal oscillating at the first oscillation frequency and supplying a third signal oscillating at a second oscillation frequency that is a sub-multiple of the first oscillation frequency.

12. The temperature sensor according to claim 11, wherein the analog-digital converter is paced by the third oscillating signal.

13. The temperature sensor according to claim 1, wherein the oscillator is a ring oscillator.

14. The temperature sensor according to claim 13, wherein the voltage at each internal node of the oscillator has a dynamic equal to the supply voltage of the oscillator.

15. The temperature sensor according to claim 10, wherein the third MOS transistors are configured to have a current passing through them varying linearly to within 10% as a function of the temperature over a temperature range, the sensor being configured to supply the measuring signal varying linearly to within 10% as a function of the temperature at least over the temperature range.

16. The temperature sensor according to claim 14, wherein the temperature range varies from −40° C. to 250° C.

* * * * *

UNITED STATES PATENT AND TRADEMARK OFFICE
CERTIFICATE OF CORRECTION

PATENT NO. : 11,274,976 B2
APPLICATION NO. : 16/709969
DATED : March 15, 2022
INVENTOR(S) : Franck Badets et al.

It is certified that error appears in the above-identified patent and that said Letters Patent is hereby corrected as shown below:

On the Title Page

Item (72), should read:
Franck Badets, Grenoble Cedex 9 (FR); Maxime Cozzi, Grenoble Cedex 9 (FR)

Signed and Sealed this
Seventh Day of June, 2022

Katherine Kelly Vidal
*Director of the United States Patent and Trademark Office*